(12) United States Patent
Jun

(10) Patent No.: US 8,816,512 B2
(45) Date of Patent: Aug. 26, 2014

(54) LIGHT EMITTING DEVICE MODULE

(75) Inventor: Eui Geun Jun, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 6 days.

(21) Appl. No.: 13/343,141

(22) Filed: Jan. 4, 2012

(65) Prior Publication Data

US 2013/0026530 A1 Jan. 31, 2013

(30) Foreign Application Priority Data

Jul. 28, 2011 (KR) .......................... 10-2011-0075205
Oct. 31, 2011 (KR) .......................... 10-2011-0111850

(51) Int. Cl.
*H01L 23/48* (2006.01)
*H01L 23/52* (2006.01)
*H01L 29/40* (2006.01)

(52) U.S. Cl.
USPC .... 257/783; 257/676; 257/782; 257/E23.018; 257/E23.039; 257/E23.166

(58) Field of Classification Search
USPC ................. 257/667, 673, E23.033, E23.039, 257/E23.043, 783, 676, 782, E23.018, 257/E23.04, E23.166
See application file for complete search history.

(56) References Cited

U.S. PATENT DOCUMENTS

| | | | |
|---|---|---|---|
| 5,298,768 A * | 3/1994 | Okazaki et al. | 257/81 |
| 6,121,637 A * | 9/2000 | Isokawa et al. | 257/99 |
| 6,610,563 B1 * | 8/2003 | Waitl et al. | 438/166 |
| 6,707,069 B2 * | 3/2004 | Song et al. | 257/79 |
| 7,026,192 B2 * | 4/2006 | Minamio et al. | 438/123 |
| 7,193,365 B2 * | 3/2007 | Ishizaka | 313/512 |
| 2002/0039001 A1 * | 4/2002 | Nagai et al. | 313/512 |
| 2002/0097579 A1 * | 7/2002 | Stalions | 362/241 |
| 2003/0020146 A1 * | 1/2003 | Yee et al. | 257/666 |
| 2004/0056268 A1 * | 3/2004 | Onozawa et al. | 257/99 |
| 2004/0080027 A1 * | 4/2004 | Grigg et al. | 257/667 |
| 2004/0203189 A1 * | 10/2004 | Chen et al. | 438/108 |
| 2004/0238829 A1 * | 12/2004 | Kurita et al. | 257/79 |
| 2006/0054914 A1 * | 3/2006 | Hsian Yi | 257/100 |
| 2007/0034997 A1 * | 2/2007 | Bauer et al. | 257/676 |
| 2008/0149962 A1 * | 6/2008 | Kim et al. | 257/99 |
| 2009/0261462 A1 * | 10/2009 | Gomez | 257/673 |
| 2011/0233746 A1 * | 9/2011 | Liu et al. | 257/676 |

* cited by examiner

*Primary Examiner* — Zandra Smith
*Assistant Examiner* — Tsz Chiu
(74) *Attorney, Agent, or Firm* — Ked & Associates, LLP (57) ABSTRACT

Disclosed is a light emitting device module including a package body, a first lead frame and a second lead frame provided on the package body, a light emitting device electrically connected to the first lead frame and the second lead frame, a first pad and a second pad respectively formed on the lower surfaces of the first lead frame and the second lead frame, and a third pad formed on the lower surface of the package body, wherein at least one of the first pad, the second pad and the third pad includes a plurality of sub-pads.

23 Claims, 10 Drawing Sheets

LIGHT EMITTING DEVICE MODULE

CROSS REFERENCE TO RELATED APPLICATION

This application claims priority under 35 U.S.C. §119 to Korean Patent Application No. 10-2011-0075205, filed in Korea on Jul. 28, 2011 and No. 10-2011-0111850, filed in Korea on Oct. 31, 2011, which are hereby incorporated in its entirety by reference as if fully set forth herein.

TECHNICAL FIELD

Embodiments relate to a light emitting device module.

BACKGROUND

Light emitting devices, such as light emitting diodes or laser diodes using group III-V or II-VI compound semiconductor materials, implement light of various colors, such as red, green, blue, and ultraviolet light, due to development of thin film growth techniques and device materials, and implement white light having high efficiency using fluorescent materials or through color mixing.

Due to development such techniques, these light emitting devices are increasingly applied to transmission modules of optical communication units, light emitting diode backlights substituting for cold cathode fluorescent lamps (CCFLs) constituting backlights of liquid crystal display (LCD) devices, illumination apparatuses using white light emitting diodes substituting for fluorescent lamps or incandescent lamps, head lamps for vehicles and traffic lights, as well as to display devices.

Here, an LED has a structure in which a P electrode, an active layer and an N electrode are stacked on a substrate, and current may be supplied to the LED through the P electrode and the N electrode.

When current is applied to the substrate, the current is supplied to the P electrode and the N electrode, and thus holes (+) are discharged from the P electrode to the active layer and electrons (−) are discharged from the N electrode to the active layer. Therefore, as the holes and the electrons are combined in the active layer, the energy level of the active layer is lowered, and the active layer emits energy in a light type simultaneously with lowering of the energy level of the active layer.

When the light emitting device is used in a backlight unit or an illumination apparatus, a light emitting device package in which the light emitting device is mounted may be disposed on a circuit board. Further, in order to achieve electrical contact between the circuit board and the light emitting device package, conductive pads may electrically connect lead frames in the light emitting device package to the circuit board. If the conductive pads are not located at proper positions thereof, a drive signal is not effectively supplied to the light emitting device package, and if a large amount of a pad material is used, the light emitting device package may be inclined on the circuit board.

SUMMARY

Embodiments provide a light emitting device module.

In one embodiment, a light emitting device module includes a package body, a first lead frame and a second lead frame provided on the package body, a light emitting device electrically connected to the first lead frame and the second lead frame, a first pad and a second pad respectively formed on the lower surfaces of the first lead frame and the second lead frame, and a third pad formed on the lower surface of the package body, wherein at least one of the first pad, the second pad and the third pad includes a plurality of sub-pads.

The light emitting device module may further include a circuit board electrically connected to the first lead frame and the second lead frame through the first pad and the second pad.

The plurality of sub-pads may be separated from each other or connected to each other.

The third pad may contact the package body and the circuit board.

The first pad and the second pad may be conductive pads.

The third pad may be a non-conductive pad.

At least one of the first pad and the second pad may include a plurality of sub-pads, and the plurality of sub-pads of the at least one of the first pad and the second pad may be arranged in a polygonal shape.

The third pad may include a plurality of sub-pads, and the plurality of sub-pads of the third pad may be arranged in at least one straight line.

In another embodiment, a light emitting device module includes a package body, a first lead frame and a second lead frame provided on the package body, a light emitting device electrically connected to the first lead frame and the second lead frame, a first pad and a second pad respectively formed on the lower surfaces of the first lead frame and the second lead frame, and a third pad formed on the lower surface of the package body, wherein the first pad is separated from the third pad by 0.5 to 0.6 mm.

The second pad may be separated from the third pad by 0.15 to 0.25 mm.

In another embodiment, a light emitting device module includes a package body, a first lead frame and a second lead frame provided on the package body, a light emitting device electrically connected to the first lead frame and the second lead frame, a first pad and a second pad respectively formed on the lower surfaces of the first lead frame and the second lead frame, and a third pad formed on the lower surface of the package body, wherein the ratio of the shortest distance between the first pad and the third pad to the distance from the end of the first pad to the end of the second pad is 0.5/3.2 to 0.6/3.2.

The ratio of the shortest distance between the first pad and the third pad to the width of the first pad may be 0.5/0.9850 to 0.6/0.8850.

The ratio of the shortest distance between the second pad and the third pad to the distance from the end of the first pad to the end of the second pad may be 0.15/3.2 to 0.25/3.2.

The ratio of the shortest distance between the second pad and the third pad to the distance from the end of the second pad to the end of the third pad may be 0.15/1.765 to 0.25/1.665.

The radio of the shortest distance between the second pad and the third pad to the shortest distance between the first pad and the third pad may be 0.15/0.6 to 0.25/0.5.

BRIEF DESCRIPTION OF THE DRAWINGS

Arrangements and embodiments may be described in detail with reference to the following drawings in which like reference numerals refer to like elements and wherein:

FIGS. 4A to 6B are views illustrating pads of the light emitting device package of FIG. 1 in accordance with second to fourth embodiments;

DESCRIPTION OF SPECIFIC EMBODIMENTS

Hereinafter, embodiments will be described with reference to the annexed drawings.

It will be understood that when an element is referred to as being 'on' or "under" another element, it can be directly on/under the element, and one or more intervening elements may also be present. When an element is referred to as being 'on' or 'under', 'under the element' as well as 'on the element' can be included based on the element.

Figure 1:
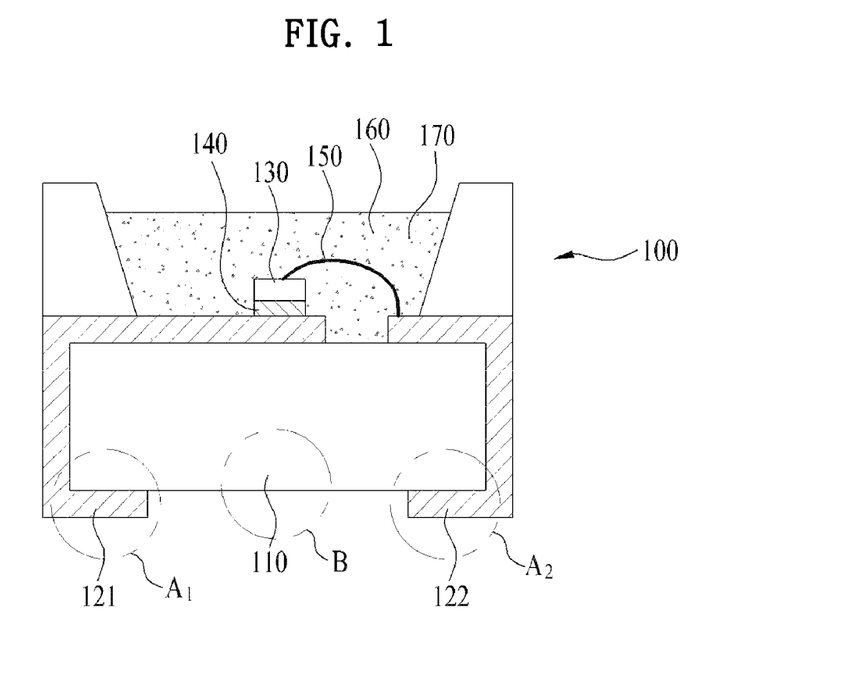
FIG. 1 is a view illustrating a light emitting device package in accordance with one embodiment.

FIG. 1 is a view illustrating a light emitting device package in accordance with one embodiment.

A light emitting device package 100 in accordance with this embodiment includes a package body 110, a first lead frame 121 and a second lead frame 122 installed on the package body 110, a light emitting device 130 installed on the package body 110 and electrically connected to the first lead frame 121 and the second lead frame 122, and a resin layer 160 surrounding the light emitting device 130.

The package body 110 may be formed of one of resin, such as polyphthalamide (PPA), silicon (Si), metal, photo sensitive glass (PSG), sapphire ($Al_2O_3$), and a printed circuit board (PCB).

Further, the upper surface of the package body 110 may have various shapes, such as a triangle, a rectangle, a polygon and a circle, according to purposes and designs of the light emitting device 130. For example, the light emitting device 130 having a rectangular shape may be used in an edge-type backlight unit (BLU), and if the light emitting device 130 is applied to a portable flashlight or a household illumination apparatus, the size and shape of the package body 110 may be changed to be easily installed in the portable flashlight or the household illumination apparatus.

The package body 110 is provided with an opened upper portion and has a cavity formed by side surfaces and a bottom surface thereof. The cavity may have a cup shape or concave bowl shape, and the inner surface of the cavity may be vertical or inclined to the bottom of the cavity. As shown in FIG. 1, the light emitting device 130 may be located on the bottom of the cavity in the package body 110.

The first and second lead frames 121 and 122 may be formed of a conductive material, for example, copper (Cu), and have the same composition.

As the light emitting device 130, a horizontal light emitting device as well as a vertical light emitting device may be disposed. The light emitting device 130 is disposed on the first lead frame 121, for example the light emitting device 130 is fixed to the first lead frame 121 by a conductive adhesion layer 140, and is connected to the second lead frame 122 electrically by a wire 150. In these embodiments or other embodiments, the light emitting device 130 may be semiconductor light emitting device, for example light emitting diode.

The resin layer 160 may surround the light emitting device 130 and the wire 150 electrically connecting the light emitting device 130 to the first and second lead frames 121 and 122, thus protecting the light emitting device 130 and the wire 150.

The resin layer 160 may be formed of a light-transmitting material, such as silicon, and include phosphors 170 to convert light at a first wavelength region emitted from the light emitting device 130 into light at a second wavelength region. Although not shown in the drawings, the resin layer 160 may include a filler to prevent the phosphors 170 from being precipitation.

Although not shown in the drawings, a lens may be disposed on the resin layer 160 and the package body 110, thereby adjusting an view angle of light emitted from the light emitting device 130.

In FIG. 1, pads may be respectively disposed in regions shown by A1, A2 and B. Conductive pads connecting the lead frames 121 and 122 to a circuit board may be disposed in the regions A1 and A2, and a non-conductive pad may be disposed in the region B to fix the package body 110 to the circuit board.

Figure 2:
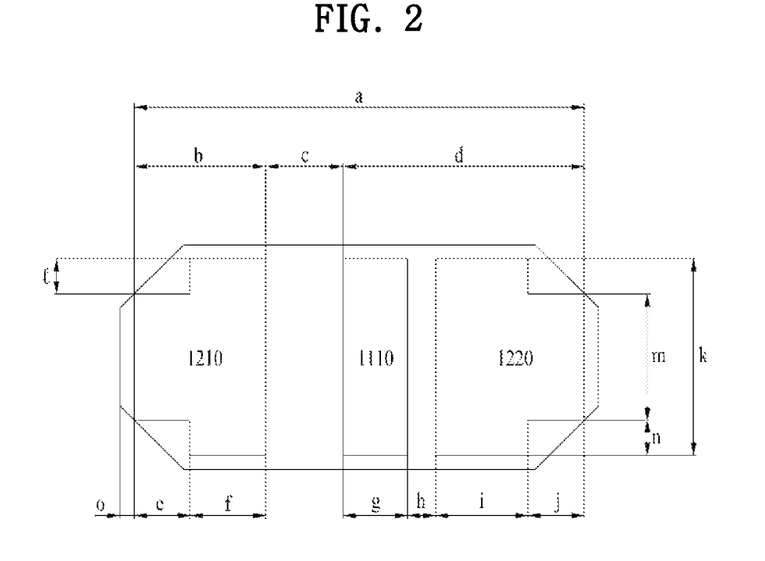
FIG. 2 is a view illustrating pads of the light emitting device package of FIG. 1 in accordance with a first embodiment.

FIG. 2 is a view illustrating pads of the light emitting device package of FIG. 1 in accordance with a first embodiment.

A first pad 1210 disposed in the region A1 of FIG. 1, a second pad 1220 disposed in the region A2, and a third pad 1110 disposed in the region B are separated from each other by designated intervals, and the package body 110 has an octagonal shape. The first and second pads 1210 and 1220 may be formed of the same material as the first and second lead frames 121 and 122, for example, copper (Cu) or other conductive materials. The third pad 1110 serves to connect the package body 110 to the circuit board and is formed of a non-conductive material. However, the third pad 1110 may be formed of a conductive material.

In FIG. 2, 'a' to 'n' represent sizes of the first to third pads 1210, 1220 and 1110 and separation distances therebetween. Here, 'a' is 3.2 mm, 'b' is 0.935 mm, 'c' is 0.55 mm, 'd' is 1.715 mm, 'e' is 0.4 mm, 'f' is 0.535 mm, 'g' is 0.4575 mm, 'h' is 0.2 mm, 'i' is 0.6575 mm, 'j' is 0.4 mm, 'k' is 1.4 mm, 'l' is 0.25 mm, 'm' is 0.9 mm, and 'n' is 0.25 mm, and the respective values may have a tolerance of ±0.05 mm. Further, a width 'o' of portions of the package body 110 protruding from the respective pads 1210, 1220 and 1110 are 0.45 to 0.65 mm.

The ratio of the shortest distance 'c' between the first pad 1210 and the third pad 1110 to the distance a from the end of the first pad 1210 to the end of the second pad 1220 may be 0.5/3.2 to 0.6/3.2. The ratio of the shortest distance c between the first pad 1210 and the third pad 1110 to the width b of the first pad 1210 may be 0.5/0.9850 to 0.6/0.8850. The ratio of the shortest distance h between the second pad 1220 and the third pad 1110 to the distance a from the end of the first pad 1210 to the end of the second pad 1220 may be 0.15/3.2 to 0.25/3.2. The ratio of the shortest distance h between the second pad 1220 and the third pad 1110 to the distance d from the end of the second pad 1220 to the end of the third pad 1110 may be 0.15/1.765 to 0.25/1.665. And, the ratio of the shortest distance h between the second pad 1220 and the third pad 1110 to the shortest distance c between the first pad 1210 and the third pad 1110 may be 0.15/0.6 to 0.25/0.5.

Such ratios are obtained in considerations of the above-described values and tolerances, for example, the shortest distance c between the first pad 1210 and the third pad 1110 is 0.55 mm, but is in the range of 0.5 mm to 0.6 mm in consideration of the above-described tolerance, and the overall distance 'a' from the end of the first pad 1210 to the end of the second pad 1220 is supposed to be 3.2 μm.

For example, on the assumption that a distance between a second pad and a third pad in the conventional light emitting device package is 0.32 mm, the distance between the second pad 1220 and the third pad 1110 in the light emitting device package in accordance with this embodiment is smaller than that in the conventional light emitting device package. Further, the overall width of the first pad 1210 of the light emitting device package in accordance with this embodiment may be 0.935 which is smaller than that of the conventional light emitting device package. The light emitting device package in this embodiment has a reduced distance between the second pad 1220 and the third pad 1110 and a reduced width of the first pad 1210, as compared to the conventional light emitting device package, thus having a reduced overall size.

The reduction in the distance between the second pad 1220 and the third pad 1110 and the reduction in the width of the first pad 1210 may cause a contact problem when the light emitting device package is disposed on the circuit board through the pads. Therefore, stable disposing of the light emitting device package to the circuit board may be achieved by changing the structure of the lead frames and dividing the electrode pad into a plurality of sub-pads, as shown in FIGS. 4A to 8.

Figure 3:
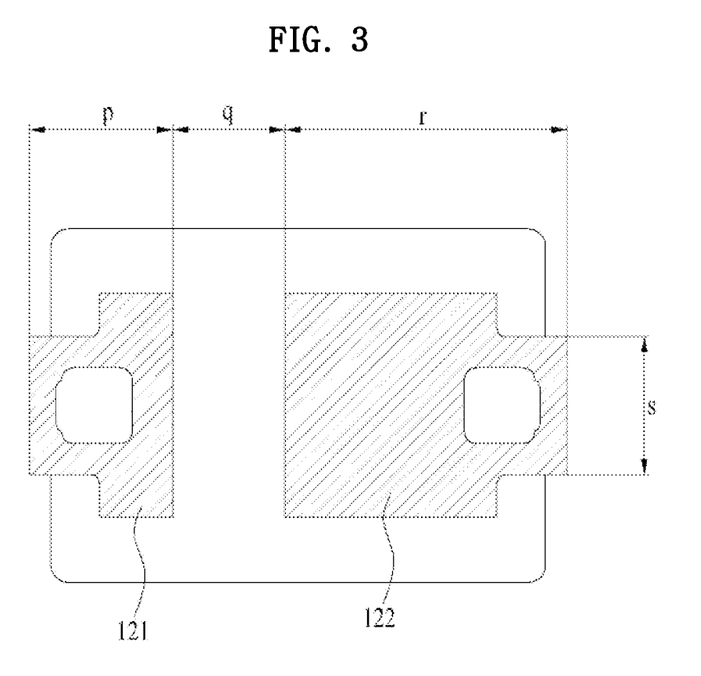
FIG. 3 is a bottom view of the light emitting device package of FIG. 1.

FIG. 3 is a bottom view of the light emitting device package of FIG. 1.

As shown in FIG. 3, the bottom surface of the package body 110 has a rectangular shape, corners of the bottom surface of the package body 110 are rounded. The first lead frame 121 and the second lead frame 122 are disposed on the lower surface of the package body 110.

Holes are respectively formed through the first and second lead frames 121 and 122 on the lower surface of the package body 110, and the package body 110 is exposed to the outside through the holes of the first and second lead frames 121 and 122. Since a pad material may be partially inserted into the holes if the holes are formed through the first and second lead frames 121 and 122, although an amount of a material of the first and second pads 1210 and 1220 is excessively large when the first and second lead frames 121 and 122 contact the first and second pads 1210 and 1220, it is possible to prevent the first and second lead frames 121 and 122 from coming off the first and second pads 1210 and 1220.

FIGS. 4A to 6B are views illustrating pads of the light emitting device package of FIG. 1 in accordance with second to fourth embodiments.

Figure 4A:
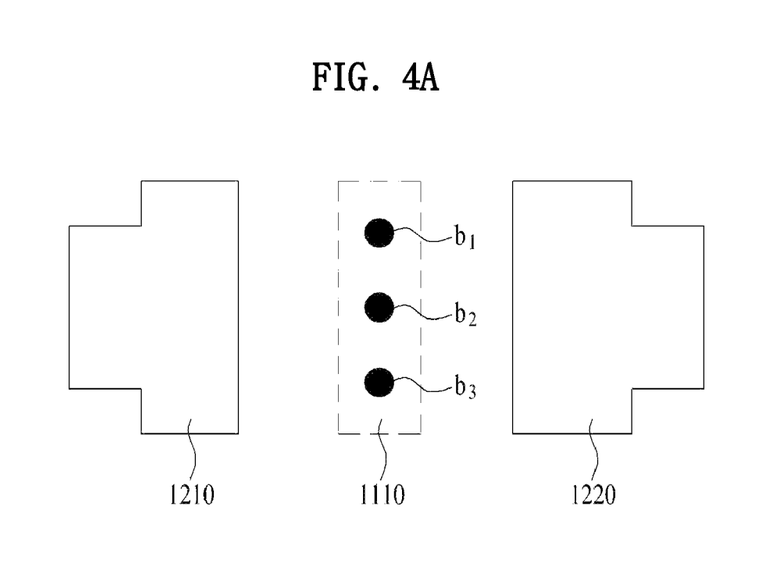

The embodiment shown in FIG. 4A is similar to the embodiment shown in FIG. 2, but differs from the embodiment shown in FIG. 2 in terms of disposition of the third pad 1110. In the embodiment shown in FIG. 4A, the third pad 1110 includes three sub-pads b1, b2 and b3 separated from each other. That is, the position of the third pad 1110 of FIG. 2 is shown in a dotted line in FIG. 4, and the three sub-pads b1, b2 and b3 are disposed within the region shown in the dotted line and are arranged in one straight line.

The sub-pads may be prepared in plural number other than three. When the third pad 1110 is disposed, as in this embodiment, the amount of the pad material may be reduced, and inclination of the package body from the circuit board due to mis-adjustment of the height of the third pad 1110 may be prevented.

Figure 4B:
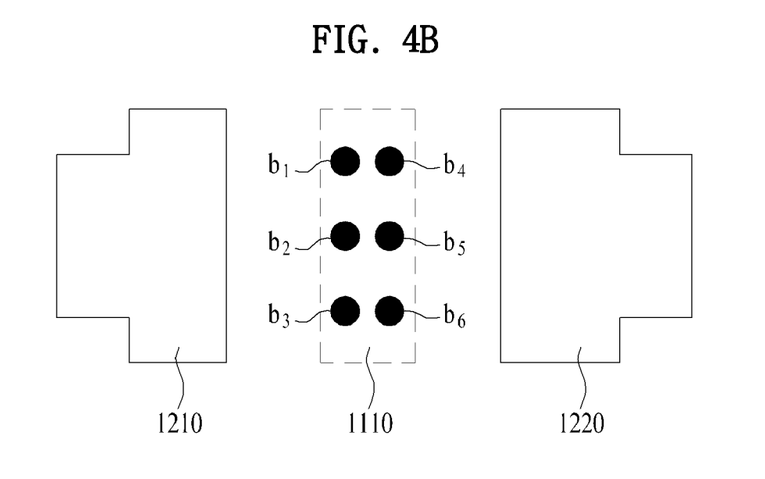

In the embodiment shown in FIG. 4B, six sub-pads b1, b2, b3, b4, b5 and b6 are disposed within the region shown in the dotted line and are arranged in two straight lines.

Figure 5A:
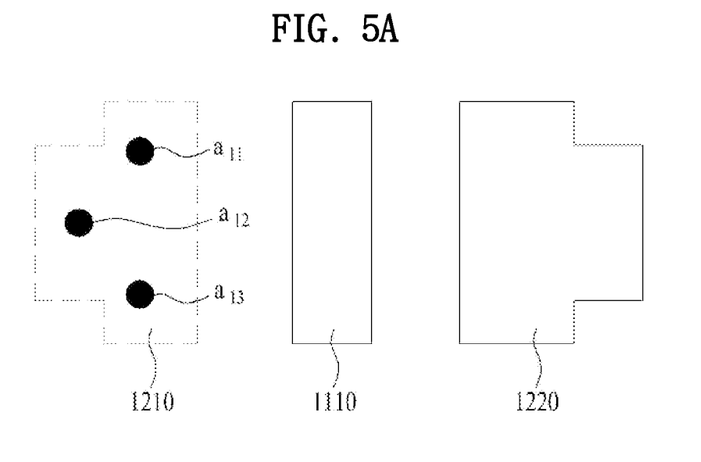
Figure 6A:
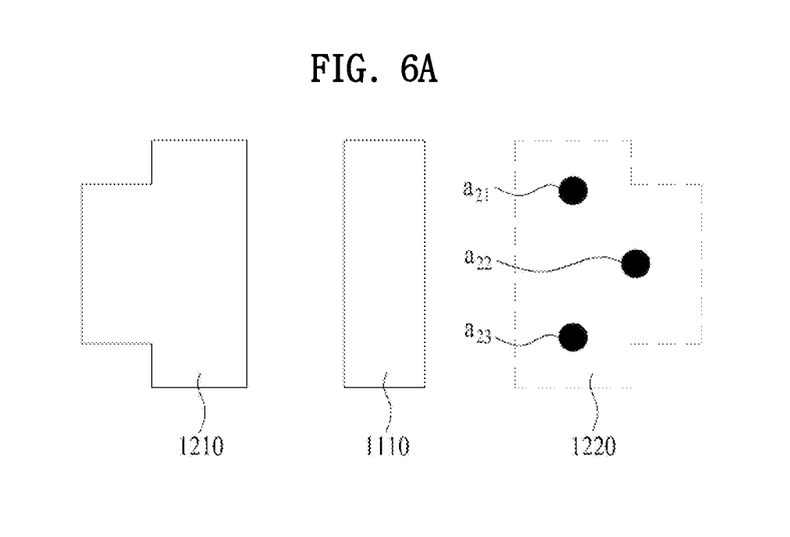

In the embodiments shown in FIGS. 5A and 6A, the first pad 1210 and the second pad 1220 respectively include three sub-pads a11, a12, a13 and a21, a22, a23, or may include two or four or more pads. The three sub-pads a11, a12 and a13 of the first pad 1210 are arranged in a triangular shape, and the three sub-pads a21, a22 and a23 of the second pad 1220 are arranged in a rectangular shape. The reason for this is to dispose the first and second lead frames in parallel on the circuit board corresponding to the shapes of the first and second lead frames.

Figure 5B:
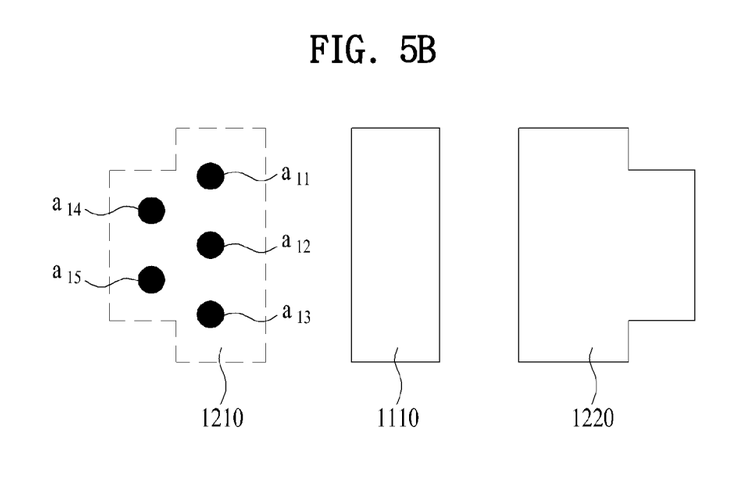
Figure 6B:
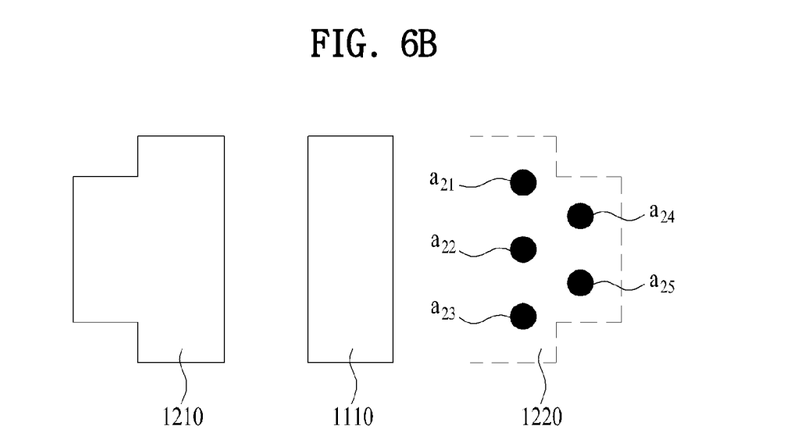

In the embodiments shown in FIGS. 5B and 6B, the first pad 1210 and the second pad 1220 respectively include five sub-pads a11, a12, a13, a14, a15 and a21, a22, a23, a24, a25. In these embodiments, the five sub-pads a11, a12, a13, a14, a15 and a21, a22, a23, a24, a25 of the first pad 1210 and the second pad 1220 are arranged in a parallelogrammic shape.

Further, the sub-pads the first pad 1210 and the second pad 1220 may be arranged in not only the triangular shape or the parallelogrammic shape but also a polygonal shape.

When the light emitting device package is connected to the circuit board, some of the above-described sub-pads may be connected to each other.

Figure 7:
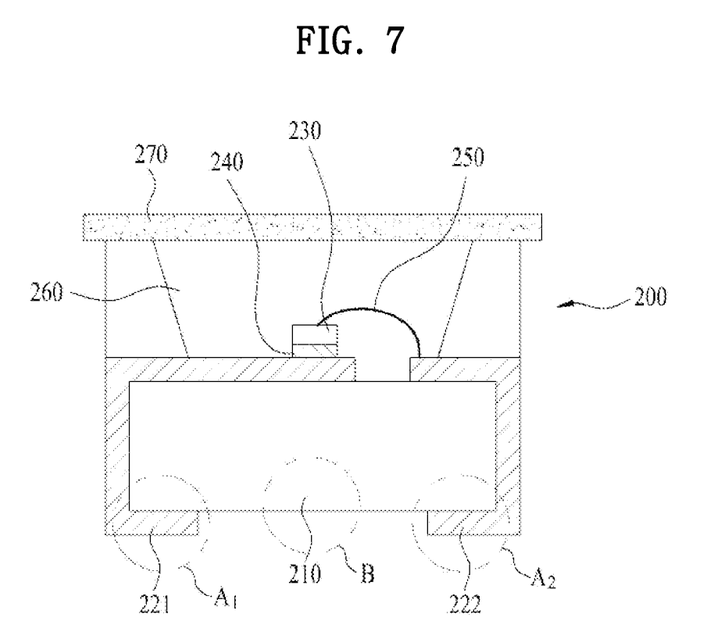
FIG. 7 is a view illustrating a light emitting device package in accordance with another embodiment.

FIG. 7 is a view illustrating a light emitting device package in accordance with another embodiment.

A light emitting device package 200 in accordance with this embodiment is similar to the embodiment shown in FIG. 1, but differs from the embodiment shown in FIG. 1 in that a resin layer 260 does not include phosphors 270 and the phosphors 270 are disposed as one layer on the surface of the resin layer 260.

In FIG. 7, first, second and third pads may be respectively disposed at regions A1, A2 and B of the lower surfaces of a first lead frame 221, a second lead frame 222 and a package body 210.

Figure 8:
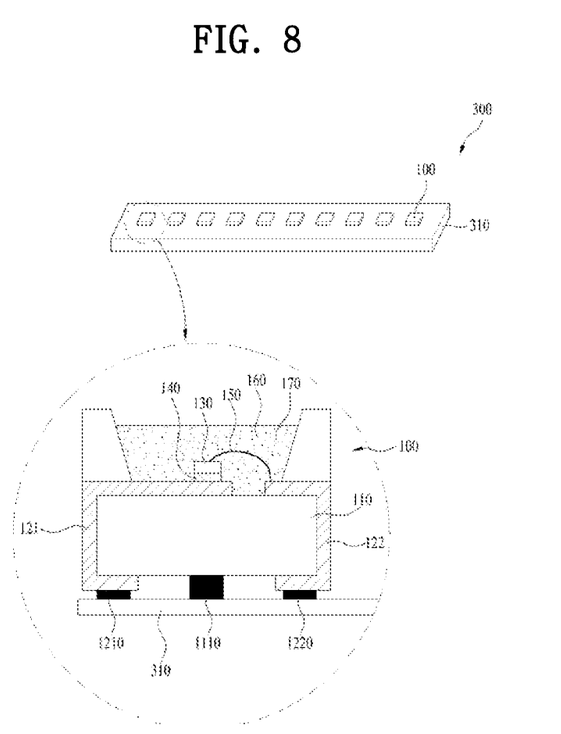
FIG. 8 is a view illustrating a light emitting device module including the light emitting device package of FIG. 1.

FIG. 8 is a view illustrating a light emitting device module including the light emitting device package of FIG. 1.

A light emitting device modules 300 includes plural light emitting device packages 100 disposed on a circuit board 310. When the light emitting device package 100 is disposed on the circuit board 310, the first lead frame 121 electrically contacts the circuit board 310 through the first pad 1210, the second lead frame 122 electrically contacts the circuit board 310 through the second pad 1220, and the package body 110 contacts the circuit board 310 through the third pad 1110. When the first to third pads 1210, 1220 and 1110 having the configurations of FIGS. 1 and 2 and FIGS. 4A to 6B are disposed, the amount of the pad material may be reduced, electrical contact between the pads 1210 and 1220 and the first and second lead frames 121 and 122 may be stable, and inclination of the light emitting device package 100 due to concentration of the pad material into a specific pad may be prevented.

Optical members, such as a light guide panel, a prism sheet, a diffusion sheet, etc., may be disposed on an optical path of the light emitting device module in accordance with this embodiment. The light emitting device module and the optical members may function as a backlight unit. In accordance with another embodiment, an image display device, an indicating device or an illumination system including the semiconductor light emitting devices or the light emitting device module in accordance with the above-described embodiments may be implemented. For example, the illumination system may include a head lamp or a streetlight.

Figure 9:
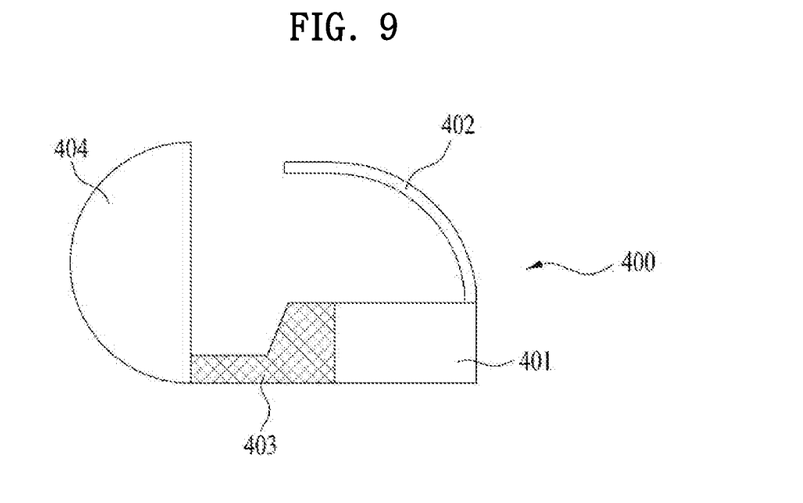
FIG. 9 is a view illustrating a head lamp in accordance with one embodiment in which a light emitting device module is disposed.

FIG. 9 is a view illustrating a head lamp in accordance with one embodiment in which a light emitting device module is disposed.

In a head lamp 400 in accordance with this embodiment, light emitted by a light emitting device module 401 in which light emitting device packages are disposed is reflected by a reflector 402 and a shade 403, and then penetrates a lens 404, thereby traveling to a region in front of a vehicle.

In the head lamp 400 in accordance with this embodiment, since a degree of lowering optical characteristics of phosphors due to heat generated from light emitting devices used in the light emitting device module 401 is small, discoloration in color coordinates due to reduction in optical efficiency at a high temperature does not occur, and thus reliability may be improved.

The light emitting device package of the light emitting device module 401 may include a plurality of light emitting devices, but is not limited thereto.

Figure 10:
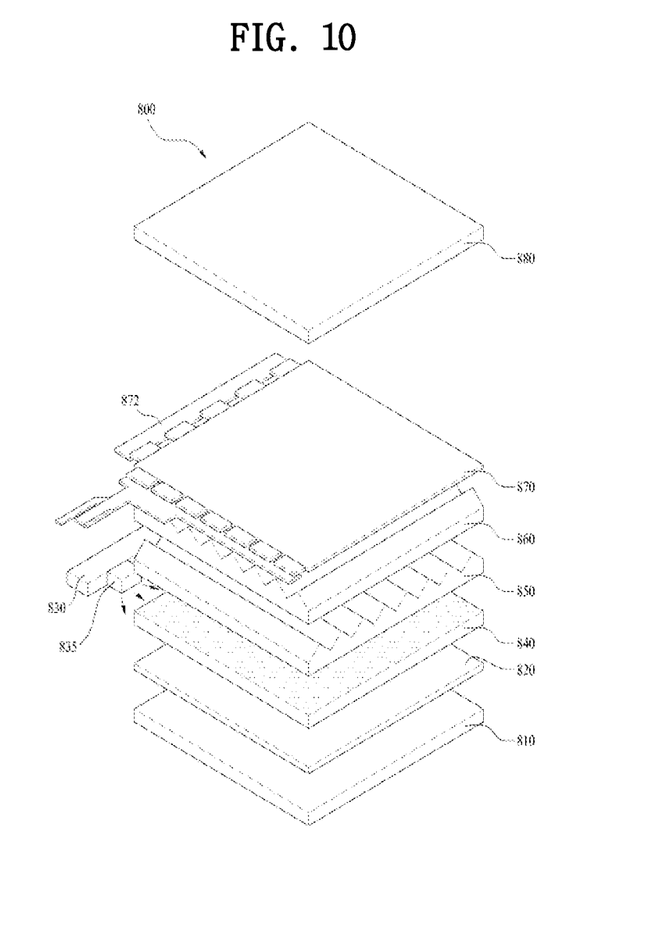
FIG. 10 is a view illustrating an image display device in accordance with one embodiment in which a light emitting device module is disposed.

FIG. 10 is a view illustrating an image display device in accordance with one embodiment in which a light emitting device module is disposed.

As shown in FIG. 10, an image display device 800 in accordance with this embodiment includes a light source module, a reflective plate 820 disposed on a bottom cover 810, a light guide panel 840 disposed in front of the reflective plate 820 to guide light emitted from the light source module to the front part of the image display device 800, a first prism sheet 850 and a second prism sheet 860 disposed in front of the light guide panel 840, a display panel 870 disposed in front of the second prism sheet 860, an image signal output circuit 872 connected to the display panel 870 to supply an image signal to the display panel 870, and a color filter 880 disposed in front of the panel 870.

The light source module includes light emitting device packages 835 on a circuit board 830. Here, a PCB may be used as the circuit board 830, and the light emitting device packages 835 contact the circuit board 830 through the above-described pads.

The bottom cover 810 may accommodate components within the image display device 800. The reflective plate 820 may be provided as a separate component, as shown in FIG. 10, or be provided by coating the rear surface of the light guide panel 840 or the front surface of the bottom cover 810 with a material having high reflectivity.

The reflective plate 820 may be formed of a material having high reflectivity and usable in an ultra-thin manner, such as polyethylene terephthalate (PET).

The light guide panel 840 scatters light emitted from the light emitting device package module so as to uniformly distribute the light throughout the entirety of a screen of the liquid crystal display device. Therefore, the light guide panel 840 is formed of a material having a high index of refraction and high transmittance, such as polymethylmethacrylate (PMMA), polycarbonate (PC) or polyethylene (PE). Further, an air guide-type display device in which the light guide panel 840 is omitted and light is transmitted in a space above the reflective plate 820 may be implemented.

The first prism sheet 850 is formed of a light transmitting and elastic polymer on one surface of a support film, and the polymer may have a prism layer in which plural three-dimensional structures are repeated. Here, such plural patterns may be formed in a strip manner in which ridges and valleys are repeated, as shown in FIG. 10.

A direction of ridges and valleys formed on one surface of a support film of the second prism sheet 860 may be perpendicular to a direction of the ridges and the valleys formed on one surface of the support film of the first prism sheet 850. This serves to uniformly distribute light transmitted from the light source module and the reflective plate 820 in all directions of the panel 870.

Although this embodiment illustrates optical sheets as including the first prism sheet 850 and the second prism sheet 860, the optical sheets may include another combination, for example, a micro lens array, a combination of a diffusion sheet and a lens array, or a combination of one prism sheet and a lens array.

As the panel 870, a liquid crystal display panel may be provided, or other kinds of display devices requiring a light source may be provided instead of the liquid crystal display panel.

The panel 870 has a structure in which a liquid crystal layer is located between transparent substrates, for stance glass bodies and polarizing plates are respectively disposed on the transparent substrates to utilize polarization of light. Here, the liquid crystal layer has intermediate properties between a liquid and a solid in which organic molecules having fluidity like a liquid, i.e., liquid crystals, are regularly arranged, and displays an image using change of molecular arrangement by an external electric field.

The liquid crystal display panel used in the image display device is formed as an active matrix, and thus uses transistors as switches to adjust voltage supplied to respective pixels.

The color filter 880 is provided on the front surface of the panel 870. The color filter 880 transmits only red, green and blue light from among light projected by the panel 870 per respective pixel, thus displaying an image.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device module comprising:
a package body having a lower surface;
a first lead frame and a second lead frame disposed on the package body, wherein a first hole is provided through the first lead frame on the lower surface of the package body, and a second hole is provided through the second lead frame on the lower surface of the package body;
a light emitting device electrically connected to the first lead frame and the second lead frame;
a first pad and a second pad respectively disposed on the lower surfaces of the first lead frame and the second lead frame; and
a third pad disposed on the lower surface of the package body,
wherein at least one of the first pad, the second pad and the third pad includes a plurality of sub-pads.

2. The light emitting device module according to claim 1, further comprising a circuit board electrically connected to the first lead frame and the second lead frame through the first pad and the second pad.

3. The light emitting device module according to claim 1, wherein the plurality of sub-pads are separated from each other or are connected to each other.

4. The light emitting device module according to claim 1, wherein the third pad contacts the package body and the circuit board.

5. The light emitting device module according to claim 1, wherein the first pad and the second pad are conductive pads.

6. The light emitting device module according to claim 1, wherein the third pad is a non-conductive pad.

7. The light emitting device module according to claim 1, wherein at least one of the first pad and the second pad includes a plurality of sub-pads, and the plurality of sub-pads of the at least one of the first pad and the second pad is arranged in a polygonal shape.

8. The light emitting device module according to claim 1, wherein the third pad includes a plurality of sub-pads, and the plurality of sub-pads of the third pad is arranged in at least one straight line.

9. A light emitting device module comprising:
a package body having a lower surface;
a first lead frame and a second lead frame disposed on the package body, wherein the first lead frame has a first hole that extends through the first lead frame on the lower surface of the package body, and the second lead frame has a second hole that extends through the second lead frame on the lower surface of the package body;
a light emitting device electrically connected to the first lead frame and the second lead frame;
a first pad and a second pad respectively disposed on the lower surfaces of the first lead frame and the second lead frame; and
a third pad disposed on the lower surface of the package body,
wherein the first pad is separated from the third pad by 0.5 to 0.6 mm, and
wherein each of the first hole and the second hole has an upper opening and a lower opening, and the upper opening contacts a bottom surface of the package body.

10. The light emitting device module according to claim 9, wherein the second pad is separated from the third pad by 0.15 to 0.25 mm.

11. The light emitting device module according to claim 9, wherein at least one of the first pad, the second pad and the third pad includes a plurality of sub-pads.

12. The light emitting device module according to claim 9, wherein at least one of the first pad and the second pad includes a plurality of sub-pads, and the plurality of sub-pads of the at least one of the first pad and the second pad is arranged in a polygonal shape.

13. The light emitting device module according to claim 9, wherein the third pad includes a plurality of sub-pads, and the plurality of sub-pads of the third pad is arranged in at least one straight line.

14. A light emitting device module comprising:
a package body having a lower surface;
a first lead frame and a second lead frame disposed on the package body, wherein a first hole is provided through the first lead frame on the lower surface of the package body, and a second hole is provided through the second lead frame on the lower surface of the package body;
a light emitting device electrically connected to the first lead frame and the second lead frame;
a first pad and a second pad respectively disposed on the lower surfaces of the first lead frame and the second lead frame; and
a third pad disposed on the lower surface of the package body,
wherein a ratio of a shortest distance between the first pad and the third pad to a distance from an end of the first pad to an end of the second pad is 0.5/3.2 to 0.6/3.2.

15. The light emitting device module according to claim 14, wherein a ratio of the shortest distance between the first pad and the third pad to a width of the first pad is 0.5/0.9850 to 0.6/0.8850.

16. The light emitting device module according to claim 14, wherein a ratio of a shortest distance between the second pad and the third pad to the distance from the end of the first pad to the end of the second pad is 0.15/3.2 to 0.25/3.2.

17. The light emitting device module according to claim 14, wherein a ratio of a shortest distance between the second pad and the third pad to a distance from the end of the second pad to an end of the third pad is 0.15/1.765 to 0.25/1.665.

18. The light emitting device module according to claim 14, wherein a ratio of a shortest distance between the second pad and the third pad to the shortest distance between the first pad and the third pad is 0.15/0.6 to 0.25/0.5.

19. The light emitting device module according to claim 14, wherein the third pad contacts the package body and is non-conductive.

20. The light emitting device module according to claim 14, wherein at least one of the first pad, the second pad and the third pad includes a plurality of sub-pads.

21. The light emitting device module according to claim 1, wherein the first pad is at least partially inserted into the first hole.

22. The light emitting device module according to claim 9, wherein the first pad is at least partially inserted into the first hole.

23. The light emitting device module according to claim 14, wherein the first pad is at least partially inserted into the first hole.

* * * * *